United States Patent
Fjerstad (10) Patent No.: US 7,906,979 B2
(45) Date of Patent: Mar. 15, 2011

(54) HIGH FREQUENCY DIFFERENTIAL TEST PROBE FOR AUTOMATED PRINTED WIRING BOARD TEST SYSTEMS

(75) Inventor: Wayne H. Fjerstad, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 127 days.

(21) Appl. No.: 12/208,590

(22) Filed: Sep. 11, 2008

(65) Prior Publication Data

US 2009/0072846 A1    Mar. 19, 2009

Related U.S. Application Data

(60) Provisional application No. 60/993,806, filed on Sep. 14, 2007.

(51) Int. Cl.
*G01R 31/20* (2006.01)
(52) U.S. Cl. .............. 324/754.07; 324/757.02
(58) Field of Classification Search .......... 324/754–765, 324/158.1; 439/482
See application file for complete search history.

(56) References Cited

U.S. PATENT DOCUMENTS

| | | | |
|---|---|---|---|
| 4,012,095 A * | 3/1977 | Doucet et al. ............. | 439/63 |
| 4,026,103 A | 5/1977 | Ichikawa et al. | |
| 4,867,707 A | 9/1989 | Widdoes | |
| 4,931,726 A * | 6/1990 | Kasukabe et al. ........... | 324/754 |
| 5,500,604 A | 3/1996 | Swarbrick et al. | |
| 6,064,195 A | 5/2000 | Clayton et al. | |
| 6,498,506 B1 * | 12/2002 | Beckous ................... | 324/761 |
| 6,682,229 B2 * | 1/2004 | Kao ........................ | 385/78 |
| 6,717,398 B2 * | 4/2004 | Cartier .................... | 324/158.1 |
| 6,798,223 B2 * | 9/2004 | Huang et al. .............. | 324/754 |
| 6,844,738 B2 * | 1/2005 | Kreager et al. ............. | 324/538 |
| 6,856,126 B2 * | 2/2005 | McTigue et al. ............ | 324/72.5 |
| 7,015,709 B2 * | 3/2006 | Capps et al. .............. | 324/754.07 |
| 7,120,840 B1 | 10/2006 | Shimanouchi | |
| 2005/0212541 A1 * | 9/2005 | Ruff et al. ................ | 324/761 |
| 2006/0006892 A1 | 1/2006 | Green et al. | |

(Continued)

FOREIGN PATENT DOCUMENTS

EP            1424565         6/2004

OTHER PUBLICATIONS

International Search Report and Written Opinion of international application No. PCT/US2008/076245, mailed Nov. 18, 2008, 10 pp.

(Continued)

*Primary Examiner* — Ha Tran T Nguyen
*Assistant Examiner* — Arleen M Vazquez
(74) *Attorney, Agent, or Firm* — Faegre & Benson LLP (57) ABSTRACT

A differential test probe for a printed wiring board test system includes a probe body having a proximal end and a distal end. Each of a plurality of coaxial cables extending from the proximal end to the distal end. The plurality of coaxial cables each includes a center conductor having an axial aperture at the distal end. The differential test probe also includes a plurality of signal pins that are each mounted in the axial aperture of the center conductor of one of the plurality of coaxial cables to electrically couple the signal pin to the center conductor. A plurality of ground pins are coupled to the probe body and selectively arranged relative to the plurality of signal pins to provide multiple signal to ground paths between the plurality signal pins and the plurality ground pins.

19 Claims, 7 Drawing Sheets

U.S. PATENT DOCUMENTS

2006/0279304 A1* 12/2006 Kuitani et al. ................ 324/761
2007/0057684 A1 3/2007 Chong et al.

OTHER PUBLICATIONS

International Search Report and Written Opinion of international application No. PCT/US2008/076234, mailed Nov. 25, 2008, 11 pp.

Breed, "Analyzing Signals Using the Eye Diagram," High Frequency Electronics, Nov. 2005, 3 pp.
"Three and Four Part S-parameter Measurements,"Anritsu Application Note, Rev. B., May 2002, 16 pp.
Schuster et al., "S-Parameter Based Eye Diagrams of High Speed Links in Comparison to Direct Measurement in Time Domain," Euro DesignCon 2005, 25 pp.

* cited by examiner

HIGH FREQUENCY DIFFERENTIAL TEST PROBE FOR AUTOMATED PRINTED WIRING BOARD TEST SYSTEMS

CROSS-REFERENCE TO RELATED APPLICATION

This application claims the benefit of Provisional Application Ser. Nos. 60/993,806, 60/993,828, 60/993,880, each filed Sep. 14, 2007, and each of which is herein incorporated by reference in its entirety. This application is related to application Ser. No. 12/208,561, filed Sep. 11, 2008, and entitled "Link Analysis Compliance and Calibration Verification for Automated Printed Wiring Board Test Systems," which is also herein incorporated by reference in its entirety.

STATEMENT REGARDING FEDERALLY SPONSORED RESEARCH OR DEVELOPMENT

This invention was made with United States Government support under contract MDA904-03-C-1400 awarded by the Maryland Procurement Office. The United States Government has certain rights in the invention.

TECHNICAL FIELD

The present invention relates to printed wiring board test systems. In particular, the present invention relates to a high frequency differential test probe for an automated printed wiring board test system.

BACKGROUND

A printed wiring board is an assembly that includes conductive pathways, or nets, etched from copper sheets that are laminated onto a non-conductive substrate. After the nets are formed, electronic components are assembled onto the printed wiring board such that the board mechanically supports and the nets electrically connect the electronic components.

As the speed of electronic circuits and systems on printed wiring boards increases well into the multi-GHz range, properties of printed wiring board nets become an ever more important consideration in the design, development, and manufacture of printed wiring boards. Measurements may be performed on the printed wiring board nets using a probe connected to a printed wiring board testing system. For example, the probe may be used to measure the response of a printed wiring board net to an applied signal. However, some printed wiring board testing probes are assembled in such a way that malfunctioning or broken elements cannot be easily replaced, resulting in replacement of the entire probe in the test system. In addition, printed wiring board testing probes typically include an arrangement of signal and ground pins that allows for only a limited pattern to be tested by the probes.

SUMMARY

In one embodiment, a differential test probe for a printed wiring board test system includes a probe body having a proximal end and a distal end. Each of a plurality of coaxial cables extends from the proximal end to the distal end. The plurality of coaxial cables each includes a center conductor having an axial aperture at the distal end. The differential test probe also includes a plurality of signal pins that are each mounted in the axial aperture of the center conductor of one of the plurality of coaxial cables to electrically couple the signal pin to the center conductor. A plurality of ground pins is coupled to the probe body and selectively arranged relative to the plurality of signal pins to provide multiple signal to ground paths between the plurality signal pins and the plurality ground pins.

In another embodiment, a system for testing a printed wiring board includes a differential test probe and a robot operable to automatically position the differential test probe relative to the printed wiring board to perform one or more measurements between ports of a network on the printed wiring board. The differential test probe includes a probe body having a proximal end and a distal end. Each of a plurality of coaxial cables extends from the proximal end to the distal end. The plurality of coaxial cables each includes a center conductor having an axial aperture at the distal end. Each of a plurality of signal pins is mounted in the axial aperture of the center conductor of one of the plurality of coaxial cables to electrically couple the signal pin to the center conductor. A plurality of ground pins is coupled to the probe body and selectively arranged relative to the plurality of signal pins to provide multiple signal to ground paths between the plurality of signal pins and the plurality ground pins.

In a further embodiment, a differential test probe for a printed wiring board test system includes a probe body having a proximal end and a distal end. Each of a plurality of coaxial cables includes a center conductor and extends from the proximal end to the distal end. Each of a plurality of spring-loaded signal pins is electrically coupled to the center conductor of one of the plurality of coaxial cables. A dielectric base plate is secured to the distal end of the probe body and includes a substantially planar surface facing away from the distal end of the probe body. A plurality of ground pins is coupled to the probe body by the base plate and selectively arranged relative to the plurality of signal pins to provide multiple signal to ground paths between the plurality of signal pins and the plurality ground pins.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
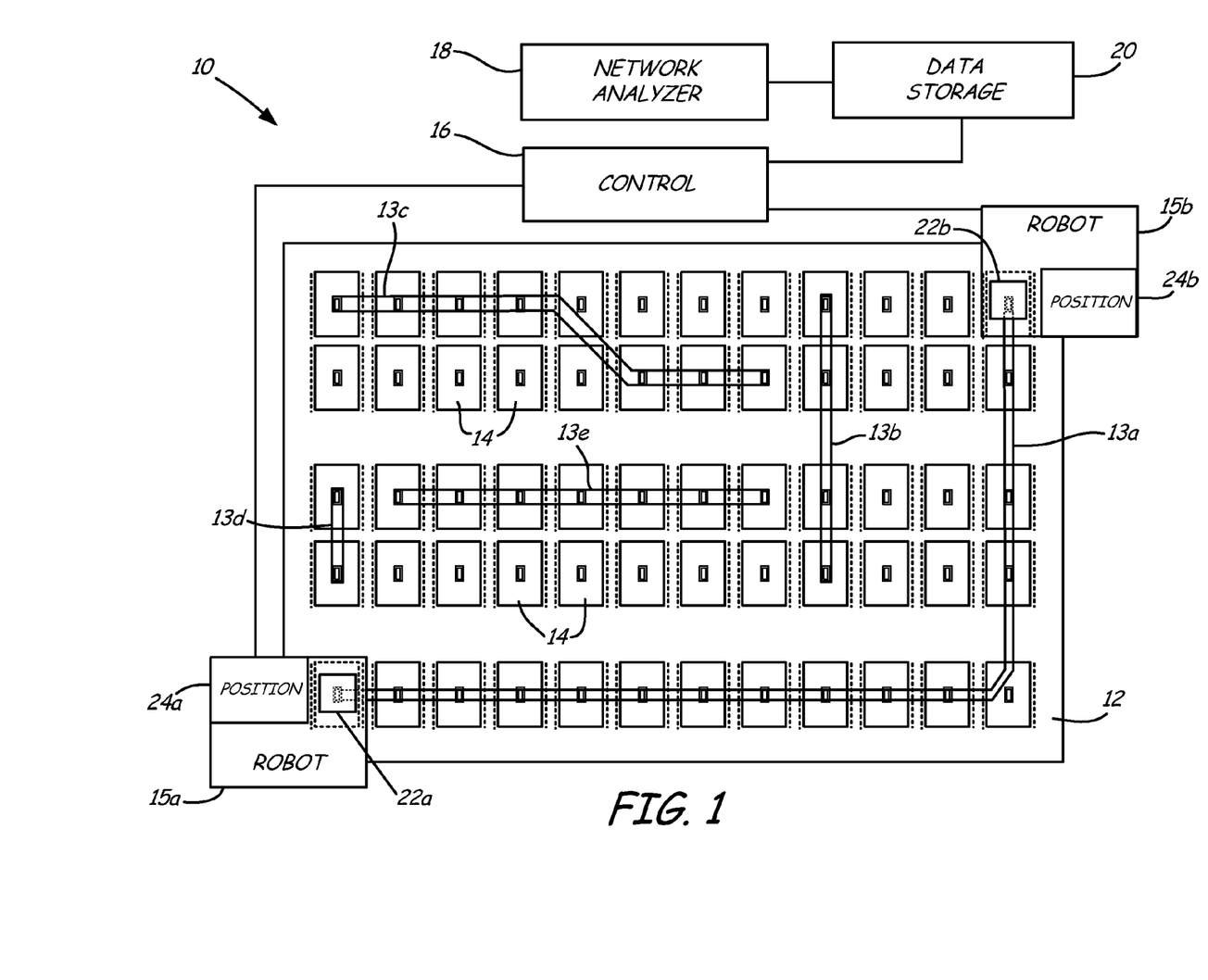
FIG. 1 is a schematic view of a printed wiring board test system including two robots for positioning differential test probes relative to a printed wiring board.

FIG. 1 is a schematic view of a printed wiring board test system 10 for testing transmission lines, or nets, formed on printed wiring board 12. Nets 13a, 13b, 13c, 13d, and 13e connect pads or vias 14 at various points on printed wiring board 12. Nets 13a-13e are shown in FIG. 1 merely by way of example, and it will be appreciated that any number of nets 13 may be formed on printed wiring board 12 to connect pads 14. Printed wiring board test system 10 includes robots 15a and 15b, controller 16, network analyzer 18, and data storage module 20. Robots 15a and 15b, network analyzer 18, and data storage module 20 are connected to controller 16. Controller 16, network analyzer 18, and data storage module 20 may be combined in a single device or may be provided as separate elements in printed wiring board test system 10.

Printed wiring board 12 may be a large printed wiring board having dimensions of up to two feet (0.61 m) by three feet (0.91 m). In other embodiments, printed wiring board test system 10 is configured to test printed wiring boards 12 of other sizes or shapes. Printed wiring board 12 is a multi-layer assembly including a layer of nets 13 comprised of a conductive material (e.g., copper) formed on a non-conductive substrate.

Robot 15a includes probe 22a and positioning system 24a, and robot 15b includes probe 22b and positioning system 24b. Robots 15a and 15b are controlled by controller 16 to position probes 22a and 22b, respectively, relative to printed wiring board 12 based on position information proved by positioning systems 24a and 24b, respectively. Probes 22a and 22b may be differential probes including pins that contact pads 14 at ends of net 13 to be tested by printed wiring board test system 10. In some embodiments, robots 15a and 15b are configured to rotate probes 22a and 22b through a wide range of angular degrees of motion to reach contacts of various pad configurations. While two robots 15a and 15b are shown, it will be appreciated that additional robots may be integrated into printed wiring board test system 10.

Positioning systems 24a and 24b may be 4-axis positioning systems that include cameras, sensors, or other positioning devices to determine the lateral and vertical position of probes 22a and 22b. In some embodiments, positioning systems 24a and 24b each include a downward looking camera, an upward looking camera, and a Z-displacement laser. The downward looking cameras of positioning systems 24a and 24b may be configured to scan through the probes 22a and 22b to view printed wiring board 12. The Z-displacement lasers positioning systems 24a and 24b may be used in conjunction with a sensor to determine the distance of probes 22a and 22b from printed wiring board 12. The upward looking camera may be used with a grid of dots calibration coupon to calculate horizontal, vertical, and Z-height offset coefficients for each of robots 15a and 15b.

Controller 16 may be an industrial personal computer operable to control robots 15a and 15b, network analyzer 18, and data storage module 20. Controller 16 executes test programs that include modules for operation of printed wiring board test system 10 and test plan development information. The test programs may be stored in data storage module 20. In addition, data acquired by probes 22a and 22b when performing measurements as established by the test programs may also be stored in data storage module 20.

Controller 16 controls robots 15a and 15b to position probes 22a and 22b, respectively, based on the running test program. In FIG. 1, probes 22a and 22b are positioned on pads 14 to perform measurements on net 13a. Controller 16 then sends one or more signals between probes 22a and 22b through net 13a and collects data related to the response of net 13a to the applied signal. The data related to the response of net 13a is then provided to network analyzer 18 by controller 16 for analysis, or stored in data storage module 20 for later processing and analysis. Controller 16 may then control robots 15a and 15b to perform similar measurements to generate response data for each of nets 13b-13e.

Network analyzer 18 may be a vector network analyzer operable to analyze both amplitude and phase properties of nets 13. Network analyzer 18 is operable to generate electrical performance characteristics of nets 13 under the control of controller 16. In some embodiments, network analyzer 18 generates scattering parameters (S-parameters) for each net 13 based on the response of net 13 to an applied signal. The S-parameters may characterize electrical properties such as gain, return loss, voltage standing wave ratio (VSWR), reflection coefficient and amplifier stability. Network analyzer 18 may also generate other types of electrical performance characteristics based on the response data from nets 13. The processed data from network analyzer 18 may be stored in data storage module 20. In some embodiments, the electrical performance characteristics are stored in a Libra/Touchstone (available from Hewlett-Packard) compliant format. Network analyzer 18 (or a separate device) may then generate graphs, plots, and other data analysis based on the performance characteristics stored in data storage module 20.

In other embodiments, additional instruments may be used to analyze the magnitude response and/or the phase response of net 13. The instruments may be used instead of or in addition to network analyzer 18 to obtain S-parameter measurements. When additional instruments are used, switches (e.g., microwave switches) may be added to robots 15a and 15b to steer electrical signals from the probes 22a and 22b, respectively, to a selected instrument.

Figure 2A:
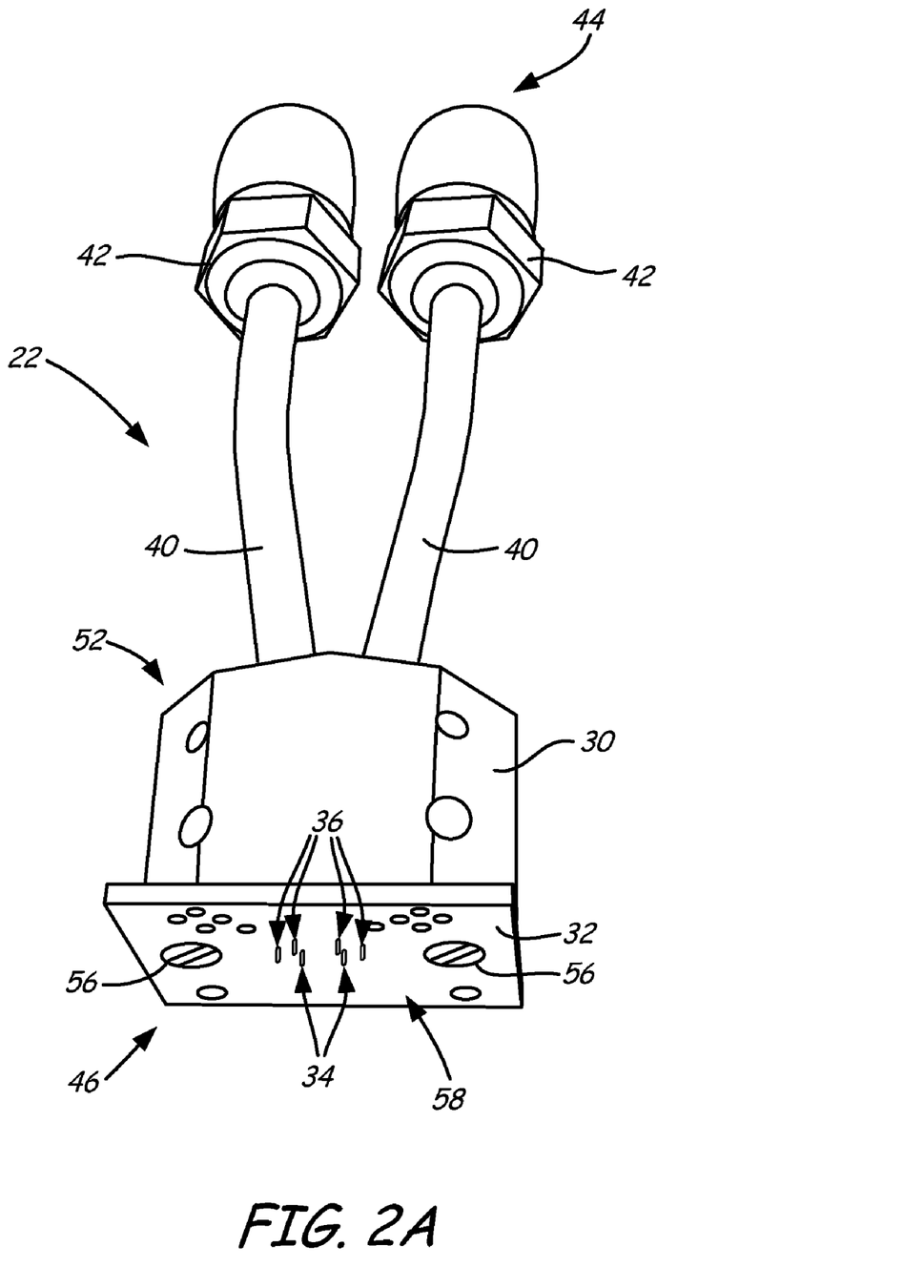
FIG. 2A is a perspective view of a differential test probe suitable for use in the printed wiring board test system shown in FIG. 1.
Figure 2B:
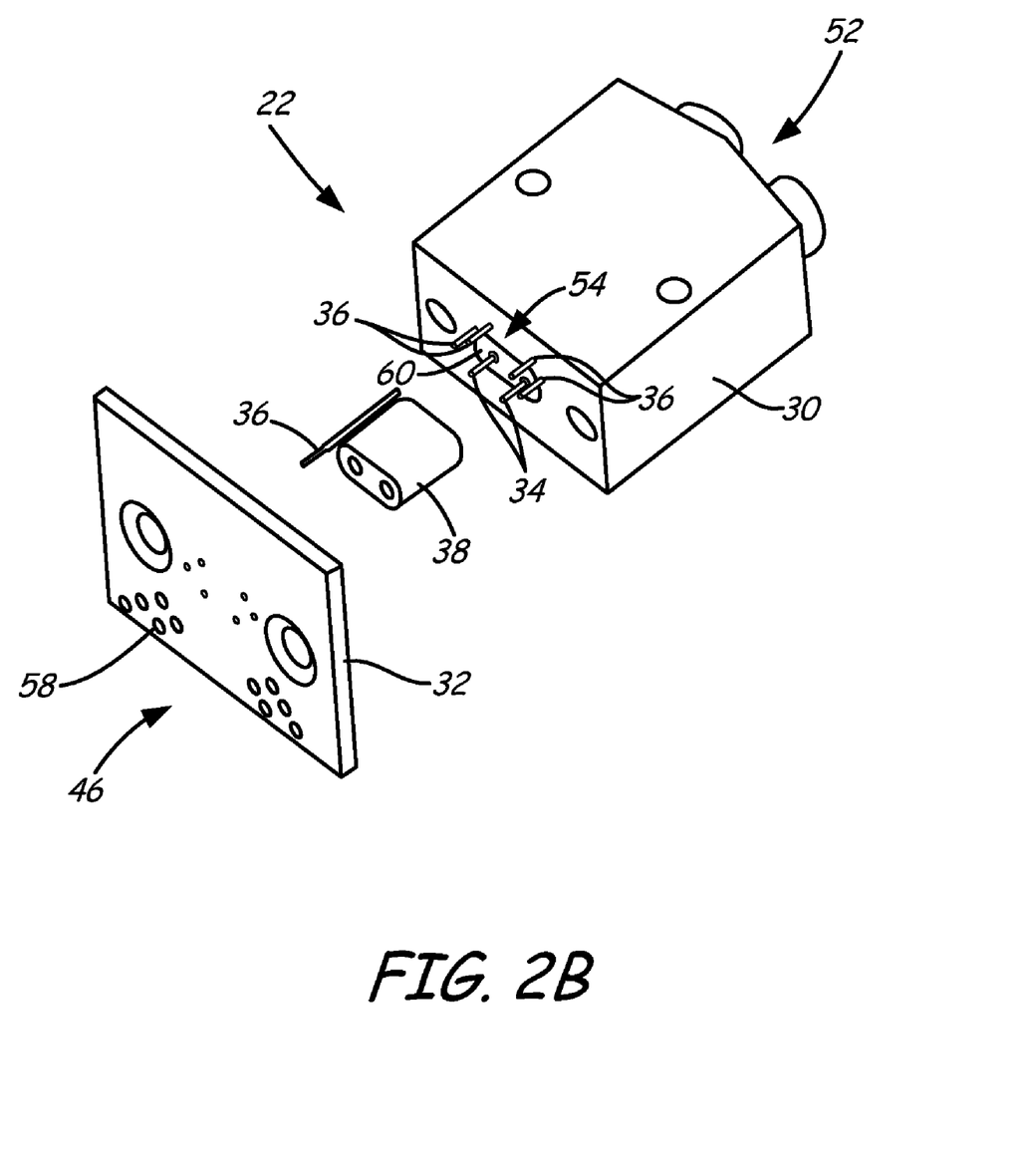
FIG. 2B is an exploded perspective view of the differential test probe shown in FIG. 2A.
Figure 2C:
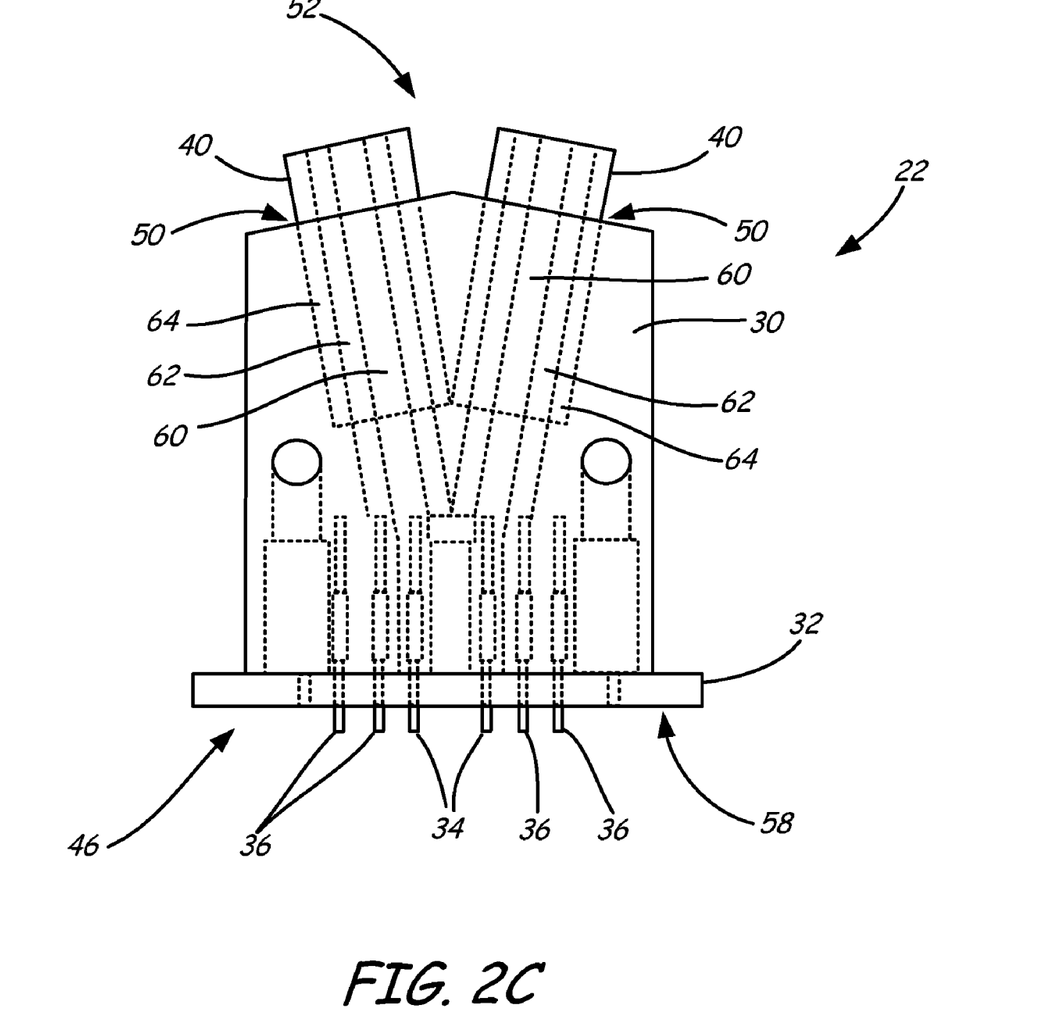
FIG. 2C is a side view of the differential test probe shown in FIG. 2A.

FIG. 2A is a perspective view of one embodiment of differential test probe 22 suitable for use as probes 22a and 22b in printed wiring board test system 10. FIG. 2B is an exploded perspective view of, and FIG. 2C is a side view of, differential test probe 22. Differential test probe 22 includes probe body 30, base plate 32, signal pins 34, ground pins 36, dielectric spacer 38, coaxial cables 40, and connectors 42. Connectors 42, which may be K connectors from Anritsu, are coupled to coaxial cables 40 at proximal end 44 of probe 22.

Probe body 30 may be comprised of a metallic material, such as brass or gold plated brass, to provide a rugged and durable core for probe 22. Probe body 30 includes apertures 50 that extend from proximal end 52 of probe body 44 to distal end 46. Proximal end 52 of probe body 30 is angled, and apertures 50 extend through probe body 30 transverse to angled proximal end 52. Apertures 50 meet to form a single aperture 54 at distal end 46 of probe body 30. The angle of coaxial cables 40 with respect to base plate 32 facilitates connection to robot 15 at proximal end 44 of probe 22 and probing of pads 14 on printed wiring board 12 at distal end 46 of probe 22.

Base plate 32 is secured to distal end 46 of probe 22 with mechanical fasteners, for example, screws 56. Base plate 32 includes a plurality of holes or apertures that allow distal ends of signal pins 34 and ground pins 36 to extend beyond substantially planar surface 58 of base plate 32. The holes in base plate 32 are small enough to mechanically hold signal pins 34 and ground pins 36 in probe body 30. Any pattern of holes may be formed in base plate 32 to accommodate any number of signal pins 34 and ground pins 36. Base plate 32 is easily removable to replace any of signal pins 34 or ground pins 36 by removing screws 56. The size of base plate 32 protects printed wiring board 12 from damage because the probing force is distributed over the entire base plate 32 when signal pins 34 and ground pine 36 make contact with printed wiring board 12. Base plate 32 may be made of a material that is non-marring to protect the probing surface of probe 22. In some embodiments, base plate 32 is comprised of a dielectric material. The dielectric material may also be transparent to allow positioning systems 24a and 24b to view printed wiring board 12 through probe 22. Furthermore, the dielectric material may be impregnated with polytetrafluoroethylene (i.e., Teflon) to allow signal pins 34 and ground pins 36 to slide easily with respect to base plate 32.

Coaxial cables 40 include each include center conductor 60, cable dielectric 62, and cable shield 64. Cable shield 64 of each coaxial cable 40 is cut back from cable dielectric 62 inserted into an aperture 50. Each coaxial cables 40 may be secured to probe body 30 by soldering or otherwise securing the rigid cable shield 64 to proximal end 52 of probe body 30. Center conductor 60 of each coaxial cable 40 is defined such that each center conductor 60 extends to distal end 46 of probe body 30. Dielectric spacer 38 is inserted into aperture 54 to maintain spacing between center conductors 60 with respect to each other and with respect to probe body 30. Dielectric spacer 38 may be comprised of Lexan or Teflon, for example.

Signal pins 34 are inserted into a small diameter hole formed into the distal end of each of center conductors 60 and held within center conductors 60 by frictional forces. The hole in each of center conductors 60 may be formed by drilling, for example. The depth of the hole into each center conductor 60 is based on the size of the signal pins 34 to provide appropriate distal end clearance of signal pins 34 from base plate 32. By coupling signal pins 34 directly to center conductors 60, good measurement signal integrity is maintained by probe 22. It will be appreciated that while two signal pins 34 are shown, any number of signal pins connected to center conductors of a corresponding number of coaxial cables may be integrated into probe 22.

Ground pins 36 are mounted in holes formed in probe body 30 that have a size substantially similar to those formed in center conductors 60. The pattern or arrangement of ground pins 36 around signal pins 34 is selectable based on the particular application for probe 22. The arrangement of ground pins 36 relative to signal pins 34 allows for multiple signal-to-ground patterns to be tested by probe 22. In addition, signal pins 34 and ground pins 36 are compliant to accommodate non-planar features on printed wiring board 12. In some embodiments, signal pins 34 and ground pins 36 are spring-loaded pins, such as Pogo pins from Everett Charles Technologies. The use of spring-loaded pins for signal pins 34 and ground pins 36 not only reduces the possibility of damage to printed wiring board 12 during testing, but also improves the durability and longevity of probe 22.

Probe 22 as described is suitable for testing the high-speed performance of nets 13 in printed wiring board test system 10. Prior to performing compliance test measurements on nets 13, probes 22a and 22b may be calibrated using a suitable calibration method to eliminate sources of systematic errors in printed wiring board test system 10. For example, measurements using network analyzer 18 use calibration to remove the impact of reflections, probe and cable losses, and probe and cable length. Industry standard probe tip calibration techniques include short-open-load-through (SOLT) calibration, through-reflect-line (TRL) calibration, and others. As will be discussed below, printed wiring board test system 10 is configured to automatically verify calibration probes 22a and 22b (i.e., without human intervention) and to provide a "hands-free" manufacturing test environment.

Figure 3:
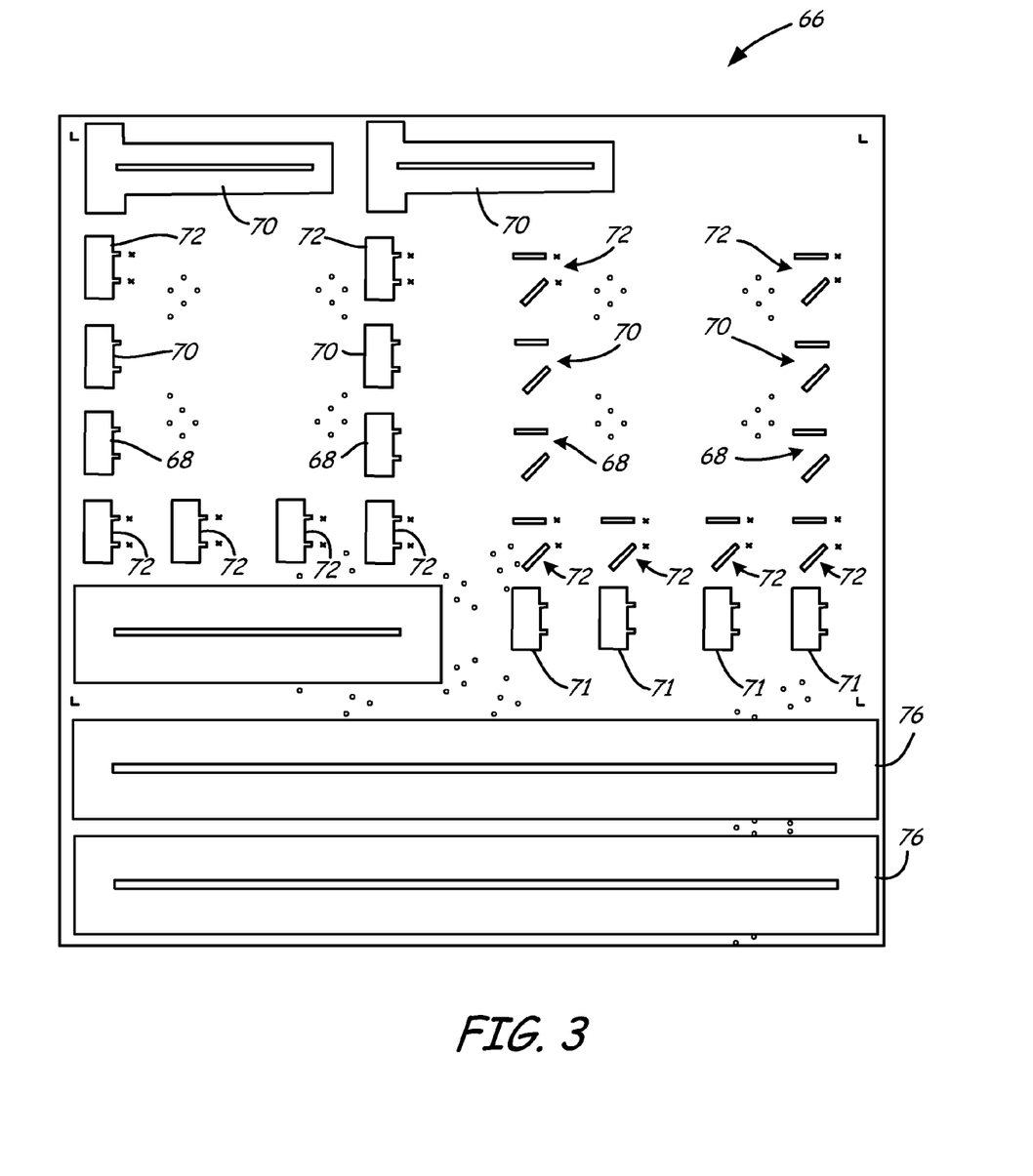
FIG. 3 is a plan view of a calibration substrate suitable for use in the automatic calibration of the test system shown in FIG. 1.

FIG. 3 is a plan view of an example calibration substrate 66 suitable for use in the automatic calibration and calibration verification of printed wiring board test system 10. Calibration substrate 66 may be loaded into printed wiring board test system 10 to allow for calibration of probes 22a and 22b before, during, or after testing of printed wiring board 12. For example, printed wiring board test system 10 may calibrate probes 22a and 22b if a new component is introduced into printed wiring board test system 10 (e.g., a replacement part), or if probes 22a and 22b detect a faulty net 13 to assure the detection is accurate. To conduct a calibration, printed wiring board test system 10 may execute a calibration sequence that positions probes 22a and 22b on calibration substrate 66 to conduct various types of calibration measurements. In the embodiment shown, calibration substrate 66 includes short test coupons 68, open test coupons 70, short/open test coupons 71, load test coupons 72, and through test coupons 74. Each of the coupons 68, 70, 71, 72, and 74 have various configurations and electrical properties to conduct SOLT calibration measurements with probes 22a and 22b. While calibration substrate 66 is shown with test coupons configured for SOLT calibration measurements, it will be appreciated that test coupons of any type or configuration may alternatively be arranged on calibration substrate 66 for other calibration techniques (e.g., TRR).

During the large number of measurements performed by probes 22a and 22b, the calibration performed by network analyzer 18 may drift, which affects the accuracy of the calibration routine of network analyzer 18. Thus, it is important to periodically validate the accuracy of the calibration measurements. To account for this, calibration substrate 66 also includes verification coupons 76 that are suitable for verifying the accuracy of the calibration conducted using test coupons 68, 70, 71, 72, and 74. Verification coupons 76 are traces that are thoroughly characterized with known good S-parameter measurements. In some embodiments, verification coupons 76 are measured across many calibration cycles to generate a database of verification standards that are stored in data storage module 20. Verification coupons 76 may be measured with probes 22a and 22b or in a separate test system to generate the database. When compiling the database, statistical outlier measurements were removed to assure consistency in the measurements stored in the database.

To provide compliance boundaries for future measurements of verification coupons 76, upper and lower compliance variation limits may be calculated from the verification standards database. A variety of techniques may be used to calculate the upper and lower variation limits from the verification standard S-parameters, such as Gaussian statistical analysis (using average and standard deviation), a National Institute of Standards and Technology (NIST) median absolute deviation (MAD) method, or NIST worst-case boundary curves. The upper and lower limits may be calculated for all S-parameter magnitude and phase values in the verification standards database. Once calculated, the upper and lower compliance variation limits indicate the type of variation expected in normal system calibrations and become the baseline standard by which future calibrations of printed wiring board test system 10 are judged. For example, the calibrations may be deemed to have passed if the measurements fall within the range defined by and including the upper and lower compliance limits. If the measurements fall outside the range defined by the upper lower compliance limits, the calibration may be deemed to have failed.

In some embodiments, the upper and lower compliance variation limits for each S-parameter is calculated from the following two formulae:

$$\text{Upper Compliance Limit} = (\text{BaselineUpper Limit} + N) + (M \times \sigma) + (P \times \lambda \times \sigma) \quad (1)$$

$$\text{Lower Compliance Limit} = (\text{Baseline Lower Limit} - N) - (M \times \sigma) - (P \times \lambda \times \sigma) \quad (2)$$

where Baseline Upper Limit and Baseline Lower Limit are numeric quantities describing a central statistic calculated from a measurement (e.g., arithmetic average or median), $\lambda$ is the frequency at which the S-parameter was measured, and $\sigma$ is a variance parameter calculated from the verification standards database for the S-parameter. For Gaussian statistics, variance parameter $\sigma$ is the standard deviation. It will be appreciated that variance parameter $\sigma$ can also be another type of variation parameter, such as median absolute deviation).

To reduce the probability of calibration failures, it is generally desirable to judiciously widen the compliance limits whenever high accuracy is not needed. Thus, the upper and lower compliance limits may be further expanded by three adjustable parameters M, P, and N as in Equations 1 and 2. These parameters are adjustable by the user generating the verification standards database, depending on the level of accuracy desired in the calibration of printed wiring board test system 10.

Adjustable parameter M is a multiplier of variance parameter $\sigma$ that expands the upper and lower compliance limits by an amount based on the statistical variation of the verifications standard measurements in the verification standards database. That is, adjustable parameter M allows the user to adjust the pass/fail performance bounds by M times the baseline S-parameter variation in the verification standards database.

Adjustable parameter P expands the upper and lower compliance limits by a frequency dependent quantity. That is, the compliance limits across the calibration frequencies widen by a factor of P times the frequency $\lambda$. Adjustable parameter P may allow the user to place more controlled emphasis on accuracy at lower frequencies and less emphasis on accuracy at higher frequencies. It is useful to allow the user to reduce the probability of calibration failures by decreasing accuracy at high frequencies, especially since calibration error and variation tend to increase with increasing frequency.

Adjustable parameter N expresses a minimum error tolerance for all calibration measurements, regardless of the measured variance in the verification standards database. This parameter is important because measurements of verification coupons 76 can exhibit very small variation because of the ideal or near-ideal measurement conditions under which the measurements are conducted. Consequently, upper and lower compliance limits based on variation in the verification standards database alone may be unnecessarily strict. In such a case, increasing adjustable parameter M does not adequately widen the compliance limits. Thus, adjustable parameter N allows the user to offset the upper and lower compliance limits without regard the measured variance of the verification standards database.

To assure printed wiring board test system 10 remains properly calibrated while testing printed wiring boards 12, controller 16 may schedule periodic measurements of verification coupons 74. This may also occur, for example, when a new printed wiring board 12 is loaded into printed wiring board test system 10, or upon detection of a faulty net 13. This is an alternative to the more time consuming calibration procedure involving measurement of test coupons 68, 70, 71, 72, and 74 to improve the efficiency of printed wiring board test system 10. If the measurements of verification coupons 74 are within the compliance range defined by the upper and lower compliance limits, printed wiring board test system 10 is properly calibrated, and testing of printed wiring boards 12 can recommence. On the other hand, if the measurements of verification coupons 74 fall outside of the compliance range, printed wiring board test system 10 may conduct a full calibration by measuring test coupons 68, 70, 71, 72, and 74.

If the measurement fails after the more extensive calibration using measurements of test coupons 68, 70, 71, 72, and 74, controller 16 may attempt to diagnose the cause of the calibration failure. Based on the type of S-parameter measurement deviation that occurs, controller 16 may perform a table based lookup of likely problems (e.g., as stored in data storage module 20) and suggests a diagnosis to the user. For example, small aberrations in an S-parameter in a confined frequency range may indicate that calibration substrate 66 is dirty, causing probes 22a and 22b to not get proper contact with calibration substrate 66. As another example, calibration failures in a small frequency range may indicate that coaxial cables 40 are loose. Complete failure across the entire frequency band may indicate the presence of a more severe problem, such as one or more pins 34 and 36 sticking or breaking.

When printed wiring board test system 10 is re-calibrated, and the re-calibration passes verification, controller 16 controls robots 15a and 15b to resume measurements of printed wiring board 12 from the point of the last known good calibration state. This is because measurements performed by printed wiring board test system since the last good calibration check are questionable since it is unknown when the calibration failed. Thus, before each periodic measurement of verification coupons 74, controller 16 stores information about the progress of the test plan for the active printed wiring board 12 in data storage module 20. This ensures minimal loss of data and minimizes lost test time because of a calibration failure.

When printed wiring board test system 10 is calibrated, testing of nets 13 on printed wiring board 12 may occur. To conduct tests on nets 13, the two signal pins 34 each of probes 22a and 22b in printed wiring board test system 10 contact two ports on each pad 14 to conduct four-port differential measurements on nets 13. The positioning of probes 22a and 22b is controlled by controller 16 based on a net list stored in data storage module 20 to allow rapid automated testing of nets 13 in succession during a test cycle. In addition, the signals applied to test each net 13 is based on test information and scripts stored in data storage module 20.

During testing, each net 13 is characterized by conducting an insertion measurement through or across the net 13. Each measurement samples a range of frequencies suitable for the data rate of the application in the ultimate environment of printed wiring board 12. In some embodiments, the measurements are performed in the frequency domain using S-parameter measurements. In other embodiments, the measurements are performed in the time domain using time domain transmission measurements. Printed wiring board test system 10 may then conduct a compliance test (i.e., a pass/fail test) based on an analysis of the measurements performed by probes 22a and 22b. The compliance test conducted by printed wiring board test system 10 that is described herein is designed to catch high speed defects in nets 13 to prevent faulty printed wiring boards 12 from entering the final assembly stage.

In one aspect of the compliance test, controller 16 evaluates the sixteen S-parameters for net 13 against both point and zone compliance criteria. The point measurement is defined as the magnitude in dB of net 13 at a specific frequency, which is compared to a performance threshold. If the point measurement equals or is better than the performance threshold, net 13 is considered to be passing, and if the point measurement is worse than the performance threshold, net 13 is considered to be failing. A measurement zone is defined as a measurement window using a start and stop frequency as the lower and upper bound. Within this frequency window, the minimum, maximum, and average magnitude can be recorded and compared to a performance threshold, and characterized as passing or failing based on the performance within the measurement zone. Compliance criteria for both point and zone measurements can be set independently for all 16 scattering parameters.

The frequency domain S-parameters for nets 13 can also be transformed into the time domain with network analyzer 18 using built-in transform algorithms. After transformation into the time domain, the same compliance criteria described above can also be applied to the time domain data set using time-domain reflectometry (TDR) measuring techniques. TDR information is enhanced by the fact that the measurement is vector error corrected with the calibration reference plane at the tips of probes 22a and 22b. This capability renders impedance coupon testing unnecessary.

In another aspect, the compliance test takes the high frequency performance data of each net 13 and predicts the expected high-speed system-level performance of net 13. The system level performance of net 13 takes into consideration the electronic components that will ultimately be connected by net 13 after final assembly of printed wiring board 12. Thus, the compliance test is capable of evaluating the performance of individual nets 13 in the context of system-level simulations performed real-time following each net-level measurement. In order to predict the system-level performance of each net 13, data storage module 20 stores virtual models representative of each of the electronic components to be connected to net 13 after final assembly. Each electronic component in the system has its own internal electrical characteristics that provide particular response parameters represented by the virtual model corresponding to the electronic component.

Figure 4:
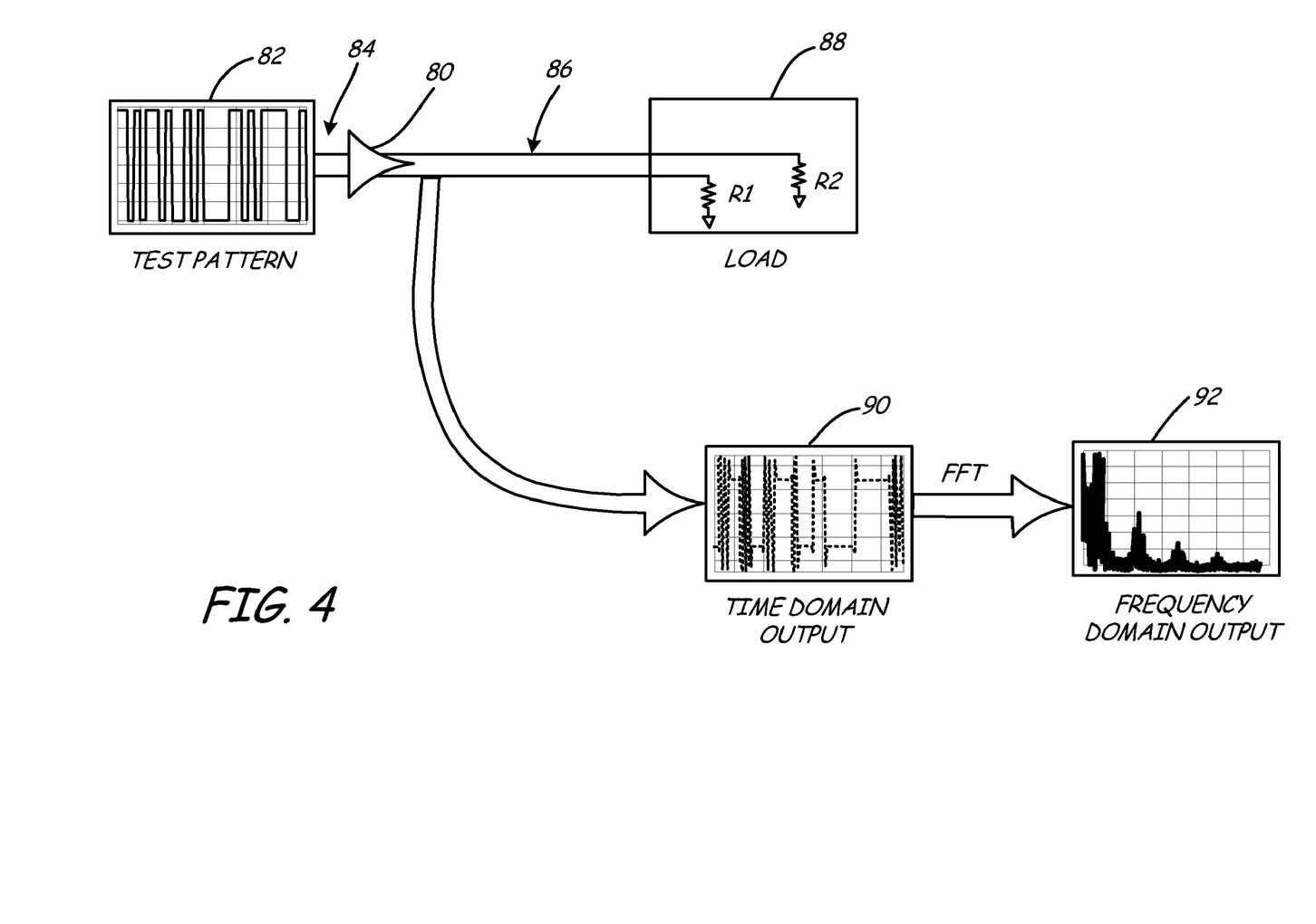
FIG. 4 is a diagrammatic view of a process for calculating the stimulus waveforms for system-level simulation of a printed wiring board net.

FIG. 4 is a diagrammatic view of a process for generating virtual models for use in a system-level simulation of a net 13. In the embodiment shown, the performance of driver 80 is measured to generate a virtual model of the system-level stimulus waveform. A selectable transient voltage test pattern, or link stimulus, 82 is applied to input 84 of driver 80. In some embodiments test pattern 82 is a worst-case test pattern. The selected test pattern 82 may be pre-processed to define the stimulus 92 across a regularly spaced list of frequencies within a frequency range, and/or to extract the bits of interest from the simulation. Output 86 of driver 80 may be terminated with a load 88. Load 88 includes resistors R1 and R2 which are selected to represent the expected load on driver 80 in the final system. In some embodiments, resistors R1 and R2 each have a resistance of 50Ω. The response of driver 80 to test pattern 82 is simulated using a circuit simulation tool, such as HSPICE to generate output differential waveform 90. Because test pattern 82 is a time domain stimulus, output differential waveform 90 is a time domain waveform. Mathematical formulae then transform output differential waveform 90 to frequency domain response 92 using, for example, a fast-Fourier transform (FFT). To obtain a full characterization of driver 80, this simulation is run for all corner cases for driver 80. One set of example simulation corners that may be used to simulate the performance of driver 80, resulting in 216 total permutations of simulations, is shown in the following Table 1.

TABLE 1

Simulation Corners

| | |
|---|---|
| Data rate | 1.90 Gbps, 2.00 Gbps, 2.25 Gbps, 2.50 Gbps |
| Power Supply | −10%, Nominal, 10% |
| Temperature | 25° C., 50° C., 75° C. |
| Process | Slow, Nominal, Fast |
| Pre-emphasis | On, Off |

The total driver response 92 to all simulation corners is stored in data storage module 20 for use in the system-level simulation of nets 13. While the process for generating a virtual model for driver 80 is shown in FIG. 4, it will be appreciated that a similar procedure may be applied to other types of devices, such as a receiver, to generate a database of virtual models for storage in data storage module 20.

Network analyzer 18 then generates S-parameters based on the output differential waveform for each simulated electronic component. For a four-port device, such as driver 80, the S-parameters generated by network analyzer 18 may be in the form of a four-by-four matrix of S-parameters, given by $$\overline{S} = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} \quad (3)$$

where ports 1 and 3 are component high and low input ports, respectively and ports 2 and 4 are the component high and low output ports, respectively, and where, for each S-parameter $S_{xy}$, y is the transmitting port and x is the receiving port. This matrix describing symmetrical transmission structures may be equivalently represented as a four-by-four modal matrix, given by $$\begin{bmatrix} \overline{S}_{DD} & \overline{S}_{DC} \\ \overline{S}_{CD} & \overline{S}_{CC} \end{bmatrix} = \begin{bmatrix} \begin{bmatrix} S_{DD11} & S_{DD12} \\ S_{DD21} & S_{DD22} \end{bmatrix} & \begin{bmatrix} S_{DC11} & S_{DC12} \\ S_{DC21} & S_{DC22} \end{bmatrix} \\ \begin{bmatrix} S_{CD11} & S_{CD12} \\ S_{CD21} & S_{CD22} \end{bmatrix} & \begin{bmatrix} S_{CC11} & S_{CC12} \\ S_{CC21} & S_{CC22} \end{bmatrix} \end{bmatrix} \quad (4)$$

where $S_{DD}$ is the differential-differential mode response of the component, $S_{DC}$ is the common-to-differential mode conversion response of the component, $S_{CD}$ is the differential-to-common mode conversion response of the component, and $S_{CC}$ is the common-common mode response of the component, and where for each modal S-parameter $S_{PQLM}$, M is the stimulus (input) port, L is the output port, Q is the mode of the stimulus (i.e., common or differential), and P is the mode of the response. The modal S-parameters are derived from the S-parameter matrix using known methods.

The differential-differential mode relates to energy that is coupled in and out of the system differentially, which is the dominant mode of transmission in the system-level simulation described. Modal conversions between common and differential modes (i.e., common-differential and differential-common modes) may be small in the frequency range of interest and can be neglected. In addition, modal conversion in the driver and receiver may be negligibly small in some cases. Thus, in some embodiments, the two-by-two matrix of differential-differential modal S-parameters (i.e., $S_{DD}$) is used for the virtual models as it adequately represents the dominant response and reduces the total calculations by a factor of four. Alternatively, all four two-by-two modal S-parameter matrices may be used for the virtual models if a full system response is desired.

In some embodiments, the modal S-parameters are pre-processed to define the response of all frequency domain components (i.e., S-parameters) across a regularly spaced list of frequencies from DC to $F_{Nyquist}$, the Nyquist frequency, which is defined below. The pre-processed S-parameters may be stored on data storage module 20 for faster system-level link simulation performance. The maximum frequency and the number of points required in the frequency domain is determined by the desired number of points and sampling time in the time domain. For example, if $N_B$ time domain samples are desired per bit period across B bit periods, then the total number of time (and frequency) domain points is $N=N_B \cdot B$. The time resolution is therefore $T_S=$(Bit period)/$N_B$. The choice of these parameters determines the Nyquist frequency, $F_{Nyquist}=\frac{1}{2}(1/T_S)$ and the frequency resolution, $F_S=(1/T_S)/N$.

All S-parameters are extrapolated to DC and to $F_{Nyquist}$ (if S-parameters are not defined at those frequencies). DC extrapolation may be performed by linear extrapolation. Magnitude extrapolation may be based on the low-frequency slope while phase is extrapolated to zero at DC. The technique used to extrapolate $F_{Nyquist}$ provides user control over magnitude extrapolation with a linear slope parameter in units of dB/GHz. This aids in correctly extrapolating insertion loss related to modeling channel loss. The S-parameter magnitudes are limited appropriately to ensure passivity. Phase is also extrapolated linearly based on an average slope near the highest frequencies. The S-parameters are then re-sampled with linear interpolation to yield a total of (N/2)+1 points from DC to $F_{Nyquist}$. Real and imaginary components of the S-parameters are interpolated separately, eliminating the need to unwrap the S-parameter phase. This pre-processing is performed on all sixteen modal S-parameters for every modeled electronic component. Once completed, each modeled component will include sixteen modal S-parameter vectors with N uniform frequency steps $F_S$.

Figure 5:
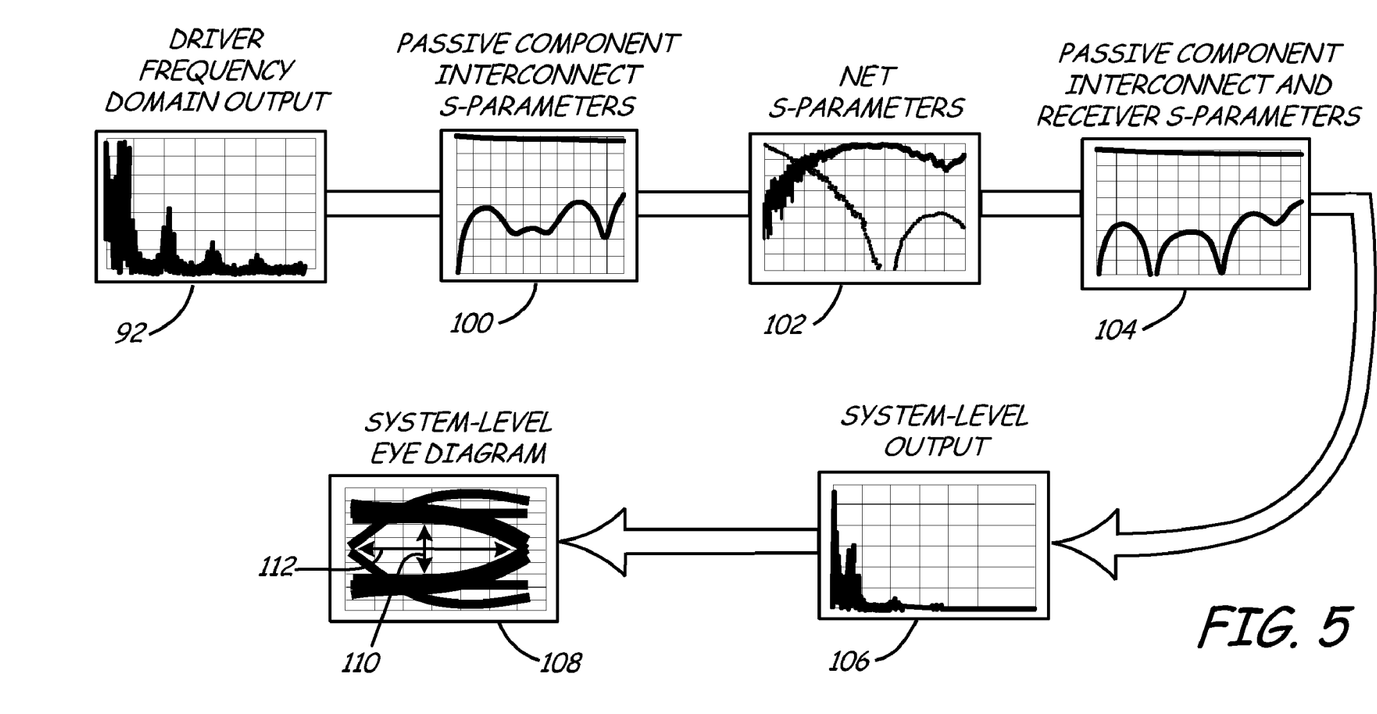
FIG. 5 is a diagrammatic view of a process for generating an eye diagram of a system-level simulation of a network that includes a printed wiring board net.

After all modeled components are pre-processed, the system level performance of net 13 may be simulated and characterized. FIG. 5 is a diagrammatic view of a process for simulating the performance of net 13 when connected to electronic components after final assembly of printed wiring board 12. FIG. 5 shows frequency domain output 92 of driver 80. Passive interconnect S-parameters 100 (representing models of connectors and the like connecting the system driver to the rest of the network) are shown after pre-processing and include multi-chip module (MCM) and Hi-Lo models. Passive interconnect S-parameters 100 are combined with net S-parameters 102 (i.e., the S-parameters of net 13) and passive interconnect and receiver S-parameters 104. Passive interconnect and receiver S-parameters 104 may be generated using the techniques described above with regard to generation of passive interconnect S-parameters 100. While net 13 is simulated connected to only a driver and a receiver, it will be appreciated that connection of any number of components to net 13 may be simulated.

In some embodiments, passive interconnect S-parameters 100, net S-parameters 102, and passive interconnect and receiver S-parameters 104 are cascaded with each other to determine the total response of the link. The four-by-four modal S-parameter matrix for each set of S-parameters is broken into four two-by-two modal matrices—$S_{DD}$, $S_{DC}$, $S_{CD}$, and $S_{CC}$. The two-by-two matrices representing the driver, net, and receiver are then cascaded, mode-by-mode, by converting all two-by-two modal S-parameters to transfer matrices, multiplying like modes, and converting back to S-parameters. Since all four two-by-two modal S-parameter matrices are cascaded in this way, it is equivalent to a 4-port cascade operation with no loss of modal information. When S-parameters 100, 102, and 104 have been combined, link output 106 results, which represents the frequency domain response of the system including virtual models of driver 80 and the receiver connected by net 13.

To characterize the system-level performance of net 13, an eye diagram may be generated from link output 106. To accomplish this, link output 106 is first transformed back to the time domain using a discrete inverse fast-Fourier transform. The resulting time-domain waveform is then bit-sliced (i.e., divided along bit segments) into eye diagram 108. Eye diagram 108 includes vertical eye opening 110 measured at the center of the eye opening relative to the horizontal axis, and horizontal eye opening 112 measured at about the zero volt line along the vertical axis. It will be appreciated that the eye opening may be calculated different manners, and other metrics may be calculated from the eye opening, including jitter and amplitude noise. System-level compliance evaluation of net 13 may then be conducted by controller 16 by comparing vertical eye opening 110 to a performance threshold stored in data storage module 20. After evaluating all nets 13 on printed wiring board 12, the performance of printed wiring board 12 may be categorized as passing or failing based on the comparison to the performance threshold. Printed wiring board 12 may alternatively or additionally be assigned to a performance rating group (e.g., Grade A, Grade B, etc.) based on a difference between vertical eye opening 110 and the performance threshold.

The eye diagram method permits nets 13 to be evaluated in the context of a time domain link analysis, which is relevant to system link specifications based on signal amplitude and timing requirements. An eye diagram can be generated for system-level analysis of each net 13 for various corner case process, voltage, and temperature variations and transmitter pre-emphasis such that worst-case system performance can be evaluated. It will be appreciated that an eye diagram is just one example of an approach to evaluate system-level performance of nets 13, and other system-level performance criteria can alternatively or additionally be applied to nets 13.

In summary, the present invention relates to a differential test probe for a printed wiring board test system including a probe body having a proximal end and a distal end. A plurality of coaxial cables are each disposed in an aperture extending from the proximal end to the distal end. The plurality of coaxial cables each includes a center conductor having an axial aperture at the distal end. The differential test probe also includes a plurality of signal pins that are each mounted in the axial aperture of the center conductor of one of the plurality of coaxial cables to electrically couple the signal pin to the center conductor. A plurality of ground pins are coupled to the probe body and selectively arranged relative to the plurality of signal pins to provide multiple signal to ground paths between the plurality signal pins and the plurality ground pins. A differential test probe having this configuration allows multiple signal to ground configurations to be tested with a single probe. In some embodiments, a base plate is secured to the distal end of the probe body. The base plate may be made of an insulating, non-marring material to protect the probing surface. In addition, the base plate may be made of a low friction material for easy movement of the ground pins.

Various modifications and additions can be made to the exemplary embodiments discussed without departing from the scope of the present invention. For example, while the embodiments described above refer to particular features, the The following is claimed:

1. A differential test probe for a printed wiring board test system, the differential test probe comprising:
    a probe body including a proximal end and a distal end;
    a plurality of coaxial cables each extending from the proximal end to the distal end, wherein the plurality of coaxial cables each includes a center conductor having an axial aperture at the distal end;
    a plurality of signal pins, wherein each signal pin is mounted in the axial aperture of the center conductor of one of the plurality of coaxial cables to electrically couple the signal pin to the center conductor; and
    a plurality of ground pins coupled to the probe body and selectively arranged relative to the plurality of signal pins to provide multiple signal to ground paths between the plurality signal pins and the plurality ground pins.

2. The differential test probe of claim 1, and further comprising:
    a base plate secured to the distal end of the probe body, wherein the base plate includes a substantially planar surface facing away from the distal end of the probe body.

3. The differential test probe of claim 2, wherein distal ends of the plurality of signal pins and the plurality of ground pins extend through the base plate past the substantially planar surface.

4. The differential test probe of claim 2, wherein the base plate is comprised of a dielectric material.

5. The differential test probe of claim 2, wherein the base plate is comprised of a substantially transparent material.

6. The differential test probe of claim 1, wherein each signal pin is angled relative to the center conductor to which the signal pin is coupled.

7. The differential test probe of claim 1, wherein each of the plurality of signal pins and plurality of ground pins comprises a spring-loaded pin.

8. A system for testing a printed wiring board, the system comprising:
    a differential test probe including (a) a probe body including a proximal end and a distal end, (b) a plurality of coaxial cables each extending from the proximal end to the distal end, wherein the plurality of coaxial cables each includes a center conductor having an axial aperture at the distal end, (c) a plurality of signal pins, wherein each signal pin is mounted in the axial aperture of the center conductor of one of the plurality of coaxial cables to electrically couple the signal pin to the center conductor, and (d) a plurality of ground pins coupled to the probe body and selectively arranged around the plurality of signal pins to provide multiple signal to ground paths between the plurality of signal pins and the plurality ground pins; and
    a control system operable to automatically position the differential test probe relative to the printed wiring board to perform one or more measurements between ports of a network on the printed wiring board.

9. The system of claim 8, and further comprising:
    a base plate secured to the distal end of the probe body, wherein each base plate includes a substantially planar surface facing away from the distal end of the probe body.

10. The system of claim 9, wherein distal ends of the plurality of signal pins and the plurality of ground pins extend through the base plate past the substantially planar surface.

11. The system of claim 9, wherein the base plate is comprised of a dielectric material.

12. The system of claim 11, and further comprising:
    a positioning system operable to transmit an electromagnetic signal through the transparent base plate to determine a position of the differential test probe relative to the printed wiring board.

13. The system of claim 9, wherein the base plate is comprised of a substantially transparent material.

14. The system of claim 8, wherein each signal pin is angled relative to the center conductor to which the signal pin is coupled.

15. The system of claim 8, wherein each of the plurality of ground pins comprises a spring-loaded pin.

16. A differential test probe for a printed wiring board test system, the differential test probe comprising:
    a probe body including a proximal end and a distal end;
    a plurality of coaxial cables each extending from the proximal end to the distal end, wherein the plurality of coaxial cables each includes a center conductor having an axial aperture at the distal end;
    a plurality of spring-loaded signal pins each mounted in the axial aperture of the center conductor of one of the plurality of coaxial cables;
    a dielectric base plate secured to the distal end of the probe body, wherein the base plate includes a substantially planar surface facing away from the distal end of the probe body; and
    a plurality of ground pins coupled to the probe body by the base plate, wherein the plurality of ground pins are selectively arranged around the plurality of signal pins to provide multiple signal to ground paths between the plurality of signal pins and the plurality ground pins.

17. The differential test probe of claim 16, wherein distal ends of the plurality of signal pins and the plurality of ground pins extend through the base plate past the substantially planar surface.

18. The differential test probe of claim 16, wherein the dielectric base plate is impregnated with polytetrafluoroethylene.

19. The differential test probe of claim 16, wherein the base plate is comprised of a substantially transparent material.

* * * * *